United States Patent [19]

Kataoka

[11] 4,315,214

[45] Feb. 9, 1982

[54] DISPLACEMENT SENSOR USING A GALVANOMAGNETIC ELEMENT POSITIONED IN A PERIODICALLY INVERTED MAGNETIC FIELD

[75] Inventor: Shoei Kataoka, Tanashi, Japan

[73] Assignee: Agency of Industrial Science & Technology Ministry of International Trade & Industry, Tokyo, Japan

[21] Appl. No.: 70,653

[22] Filed: Aug. 28, 1979

[30] Foreign Application Priority Data

Aug. 30, 1978 [JP] Japan ................................. 53-104976

[51] Int. Cl.$^3$ ......................... G01B 7/14; G11C 19/08
[52] U.S. Cl. ........................................ 324/208; 365/9; 365/29; 365/32
[58] Field of Search ............... 324/207, 208, 251, 252; 338/32 H; 329/92 H; 365/7-9, 29, 32

[56] References Cited

U.S. PATENT DOCUMENTS 3,806,899  4/1974  Myer ..................................... 365/32
3,893,059  7/1975  Nowak ............................. 323/94 H
4,119,911  10/1978  Johnson, Jr. ........................ 324/208

OTHER PUBLICATIONS

Sugiyama et al., "Direct Measurement . . . with a Micro Hall Element", Proceedings of the IEEE, vol. 64, No. 11, Nov. 1976, pp. 1643-1644.

Kataoka et al., "New Galvanomagnetic Device with Directional Sensitivity" Proceedings of the IEEE, vol. 59, No. 9, Sep. 1971, pp. 1349.

Primary Examiner—Gerard R. Strecker
Assistant Examiner—Walter E. Snow
Attorney, Agent, or Firm—Oblon, Fisher, Spivak, McClelland & Maier

[57] ABSTRACT

Disclosed is a displacement sensor, comprising a pair of plates of magnetic bubble material disposed parallelly to each other across a space and a galvanomagnetic element disposed within the magnetic field formed in the aforementioned space and adapted to be allowed to move parallelly to the inner surfaces of the aforementioned pair of plates. The sensor thus constructed detects displacement or vibration with the galvanomagnetic element retained in a non-contact relation with the pair of plates on the principle that the output signal from the galvanomagnetic element varies in proportion to the amount of movement of this element in the space in response to displacement or vibration.

7 Claims, 13 Drawing Figures

DISPLACEMENT SENSOR USING A GALVANOMAGNETIC ELEMENT POSITIONED IN A PERIODICALLY INVERTED MAGNETIC FIELD

BACKGROUND OF THE INVENTION

This invention relates to a displacement sensor for detecting very minute displacements and vibrations directly in the form of electric signals.

For electrical detection of displacements and vibrations, it has been customary to adopt sensors of the type which utilize variation in capacitance, induction, etc. These sensors have the disadvantages that they necessitate complex configurations which take up a large amount of space, that they do not always respond linearly to displacements or that they issue electrical outputs in differential forms in response to vibrations, and that their outputs, therefore, are not in the form of numerical values directly proportional to vibrations or displacements. The sensor which utilizes the function of a differential transformer and serves to detect very minute displacements has the disadvantages that it has a large mass and fails to detect minute vibrations. The sensor of the type which utilizes the phenomenon of electromagnetic induction has an electrical output which is proportional to the velocity of movement and not to the amount of displacement as is observed in the pickup head of a phonograph and, therefore, has the disadvantage that it issues a very small output in response to vibrations of a low frequency.

If a sensor is to provide extremely accurate measurement, all the components of this sensor are naturally required to be fabricated with high precision, which is very difficult to obtain.

The main object of this invention is to provide a displacement sensor capable of detecting displacements or vibrations on the sub-micron order in a non-contact state.

Another object of this invention is to provide a displacement vibration sensor of very small size and simple configuration, which enjoys improved properties and novel functions unattainable by the conventional countertypes, namely a displacement sensor that produces an electrical output proportional to the amount of displacement or, in response to a large displacement, generates an output directly in the digital pulse signals and that, when used for the detection of vibrations, issues an electrical oscillatory output proportional to the displacement involved without reference to the frequency.

SUMMARY OF THE INVENTION

To accomplish the object described above according to the present invention, there is provided a displacement sensor which comprises either a pair of plates of magnetic bubble material disposed parallelly to each other with a small space therebetween or one plate of magnetic bubble material and one ferromagnetic plate similarly disposed, and a galvanomagnetic element supported within the magnetic field formed in the aforementioned space and adapted so as to be allowed to move parallelly to the inner surfaces of the aforementioned pair of plates.

In a magnetic bubble plate, there exist magnetic domains at given intervals (of 5–150 μm) the adjacent ones of which are magnetized inversely. When two such magnetic bubble plates are disposed parallelly to each other with a small space therebetween, the intensity of the respective magnetic fields within respective opposed magnetic domains is uniform, whereas the directions of the magnetic fields at the respective boundaries are inverted. Therefore, there exists very steep gradient of magnetic field at the respective boundaries and, in this inverted region, the intensity of the magnetic field is in direct proportion to the distance in the direction parallel to the magnetic bubble plates from the center of the boundary. For this reason, it is possible to detect the sub-micron order displacement or vibration of an object merely by fixing the object to a galvanomagnetic element, disposing the galvanomagnetic element between but free from contact with a pair of magnetic bubble plates at the boundary of magnetic inversion and measuring the output voltage of the galvanomagnetic element.

DESCRIPTION OF PREFERRED EMBODIMENTS

Figure 1:
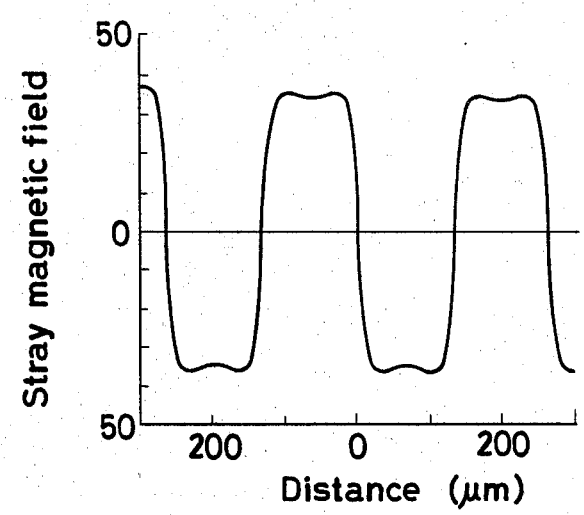
FIG. 1 is a diagram illustrating the distribution of the stray magnetic fields of magnetic strip domains.

The present inventor and his coworker fabricated a micro Hall element having an active dimension measuring $5 \times 5 \times 2.6$ μm$^3$ from a single crystal of InSb, and by bringing this element into contact with a magnetic bubble material, succeeded in directly measuring the distribution characteristics of the stray magnetic fields from magnetic bubble domains (Proc. IEEE, Vol. 64, No. 11, Nov. 1976, pp 1643–1644). Then, an external magnetic field was applied in parallel to the surface of a magnetic bubble material (YFeO$_3$) to generate magnetic strip domains in a regular parallel arrangement. (No bias field is applied). Upon measuring the distribution of the stray magnetic fields of these strip domains by the method just described, the present inventor discovered that, as shown in FIG. 1, the magnetic field inverts at regular intervals and that within an extremely narrow border region (5-10 $\mu$m in the case of YFeO$_3$) the strength of the magnetic field changes in direct proportion to distance. This border region may be much smaller in the case of garnet.

Figure 2:
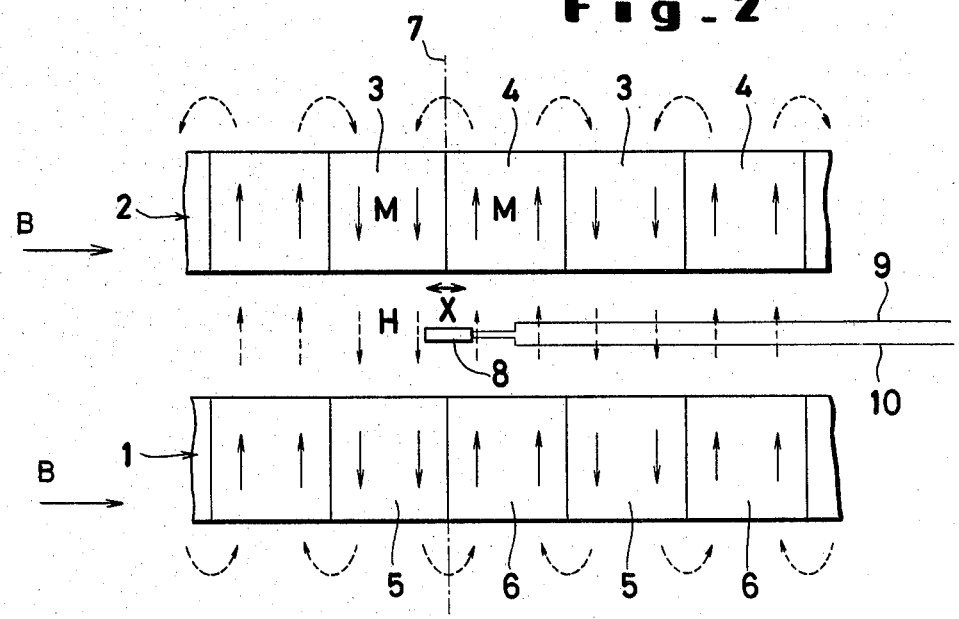
FIG. 2 is a structural diagram of one embodiment of the displacement sensor according to the present invention.

The present invention is based on this discovery and was perfected through advanced research and experimental work. FIG. 2 illustrates the principle of the present invention. A pair of plates 1, 2 of magnetic bubble material are disposed in parallel at a given interval. When an external magnetic field is applied to the pair of plates in a parallel direction, regularly arranged magnetic strip domains are generated throughout the magnetic bubble material. The pattern of these strip domains remains unchanged even when the external magnetic field is removed. The smaller the separation between the pair of plates 1 and 2, the stronger the magnetic field in the space therebetween. However, what is important to the present invention is the uniformity in strength of the magnetic field in the space, i.e. the regular parallel arrangement of the pair of plates, rather than the strength of the magnetic field in the space. Therefore, the space may be made large enough for a galvanomagnetic element to be movable between the pair of plates in a non-contact state. In view of this fact, the distance between the plates may be substantially equal to the thickness of a single plate.

Figure 3:
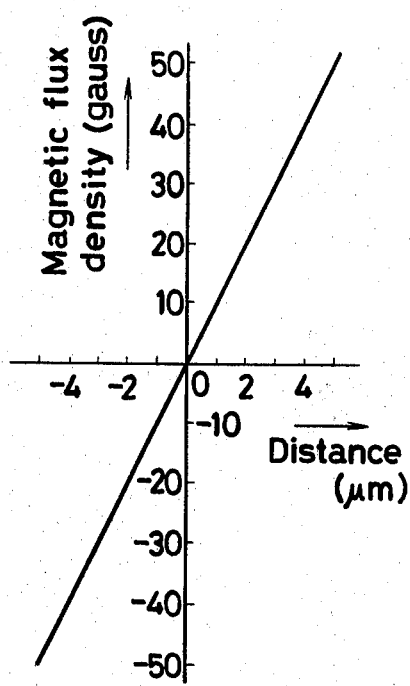
FIG. 3 is a graph showing the variation of magnetic flux density in the immediate vicinity of the boundary of magnetic inversion as a function of the distance from the boundary of magnetic inversion.
Figure 4:
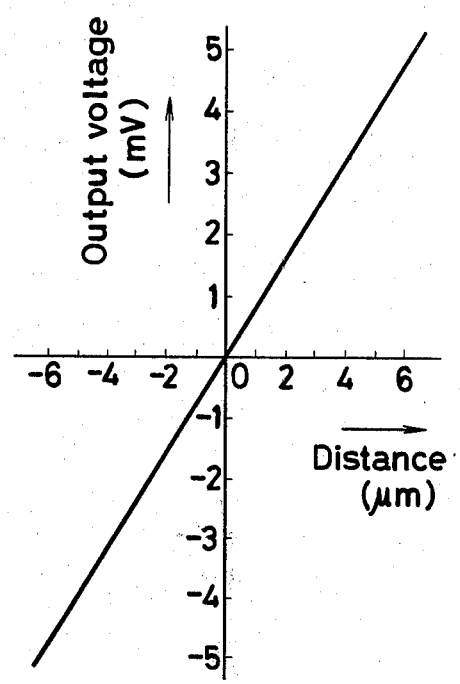
FIG. 4 is a graph showing the variation of output voltage of the galvanomagnetic element as a function of the displacement of the sensor of the present invention.

As was noted above, in each of the plates 1, 2 of magnetic bubble material, there exist alternate magnetic domains 3, 4 and 5, 6 having mutually inverted magnetism. In terms of magnetism, since the magnetic domains 3, 5 and 4, 6 which are vertically opposed to each other are magnetized in the same directions, the space interposed between the pair of magnetic bubble plates 1, 2 gives rise to a magnetic space wherein the directions of the magnetic fields are spatially inverted as indicated by the dotted lines. The strength of the magnetism in this magnetic space is uniform in the direction perpendicular to the surfaces of magnetic plates because of the parallel arrangement of the pair of plates. As a result, the relation between the particular position in this space where the directions of the magnetic fields are inverted, namely the position separated by a distance "x" in the horizontal direction (direction parallel to the magnetic plates) from the center of the boundary 7 of the magnetic inversion, and the magnetic flux density "B" varies linearly within a certain range as illustrated in FIG. 3. When a galvanomagnetic element 8 such as a Hall element which is capable of detecting the magnetic flux density "B" is disposed in this space, therefore, a displacement of the galvanomagnetic element 8 results in generation of an output voltage proportional to the displacement as shown in FIG. 4. The value of the displacement shown in FIG. 4 can be obtained when an electric current of 1 mA is applied to a Hall element having an active dimension measuring $5 \times 5 \times 2.6$ $\mu$m$^3$.

In the embodiment of FIG. 2, the plates 1, 2 of magnetic bubble material are made of orthoferrite. The magnetic domains 3, 4 and 5, 6, therefore, have a size of about 150 $\mu$m and the boundary 7 of magnetic inversion has a size of about 10 $\mu$m and the strength of the magnetic field varies linearly within the range of the size of the boundary. The intensity of the magnetic field is about $\pm$50 gausses at most. A sensor using a minute Hall element having about 100 mV/mA.kG of sensitivity, therefore, is capable of generating a variation of output voltage of up to a few mV in response to a displacement of a few $\mu$m by disposing the minute Hall element in a space wherein the magnetic field of the boundary 7 can be measured. Generally in the boundary of magnetic inversion, quite satisfactory linearity is obtained in the relation between the output voltage and the displacement within a certain range. Although the Hall element generally possesses two input terminals and two Hall output terminals, only one lead 9 connected to the input terminals and one lead 10 connected to the Hall output terminals are indicated in the galvanomagnetic element of the sensor of FIG. 2 for the sake of simplicity.

Figure 5:
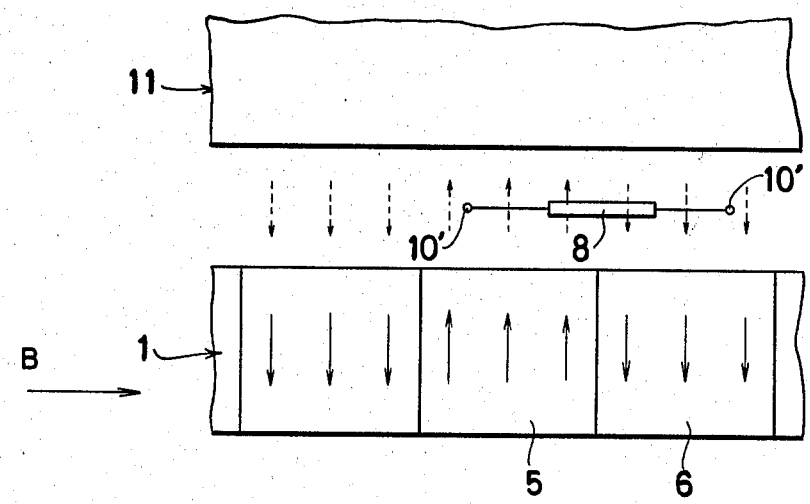
FIG. 5 is a structural diagram of another embodiment of the displacement sensor according to this invention.

FIG. 5 illustrates another embodiment of this invention. In place of two plates of magnetic bubble material shown in FIG. 2, one plate 1 of magnetic bubble material and one ferromagnetic plate 11 are disposed parallelly to each other. Also in this case, magnetic fields which are alternately inverted in the horizontal direction are generated by the strip domains in the space interposed between the plate 1 of magnetic bubble material and the ferromagnetic plate 11. Thus, between the Hall output terminals 10' of the magnetoresistive element 8 disposed in this space, there is obtained an output voltage which is proportional to the relative displacement between the galvanomagnetic element 8 and the plate 1 of magnetic bubble material.

In the embodiment of FIG. 2 and FIG. 5, a displacement in one direction parallel to the plate can be converted into an electric signal with high accuracy because a possible displacement of the galvanomagnetic element 8 in the vertical direction has no effect upon the output of the sensor. This is because magnetic field is uniform in the vertical direction.

Figure 6:
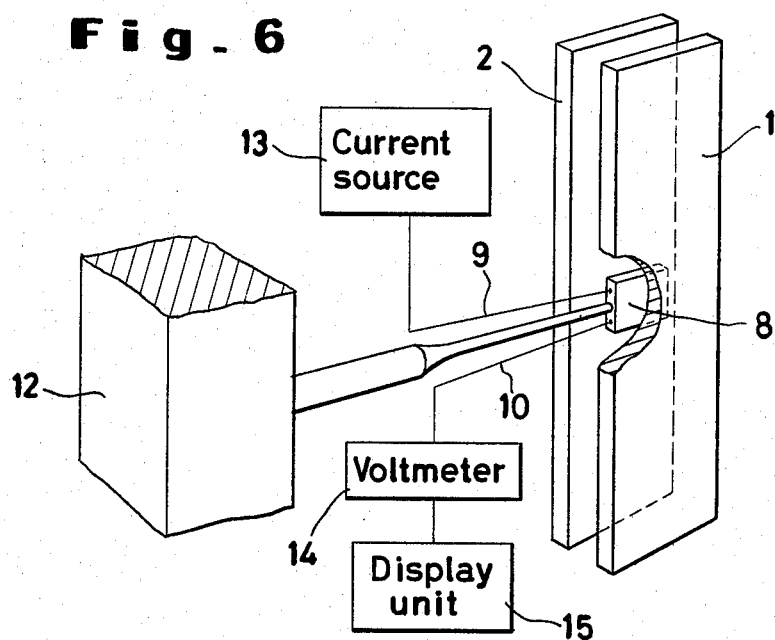
FIG. 6 is an explanatory diagram illustrating the sensor of this invention as held in a position for actual measurement.

The galvanomagnetic element 8 is fastened to an object 12 subjected to measurement of displacement or vibration and the aforementioned galvanomagnetic element is disposed so as to be inserted between the pair of plates 1, 2 of magnetic bubble material as illustrated in FIG. 6. Electric current from a current source 13 is applied to the input terminals of the element 8 through lead 9 and the Hall output voltage produced by the element is measured by a voltmeter 14. The displacement or vibration of the object subject to measurement is determined from the changes in the measured output voltage. A digital indicator 15 may be connected to the voltmeter 14 as occasion demands and thereby the displacement or vibration of the object subject to measurement can be read out directly from the digital indicator.

It is of course also possible to fasten the object subject to measurement to the pair of magnetic bubble material plates and fix the galvanomagnetic element in position therebetween.

Figure 7:
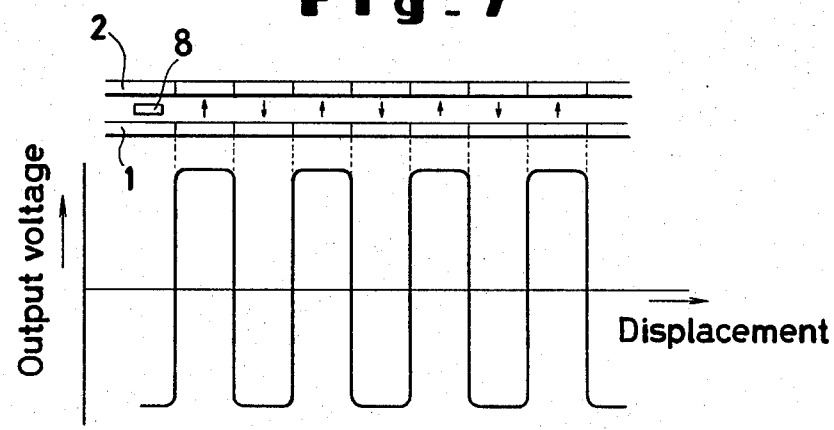
FIG. 7 is a graph showing the output voltage as a function of the displacement of the galvanomagnetic element over a plurality of portions of magnetic inversion.

Now, still another embodiment of this invention will be described. When the relative displacement between the galvanomagnetic element 8 and the plate 1 of magnetic bubble material is very large, the galvanomagnetic element 8 is caused to move past a plurality of magnetic domains of alternately inverted magnetisms, namely past a plurality of boundaries. Consequently, the displacement is converted into a number of pulses corresponding to the number of oppositely directed magnetic fields past which the element 8 has moved, as illustrated in FIG. 7. In other words, the displacement can be detected electrically in the form of a digital signal.

Now, the invention used for detection of vibrations will be described.

Figure 8:
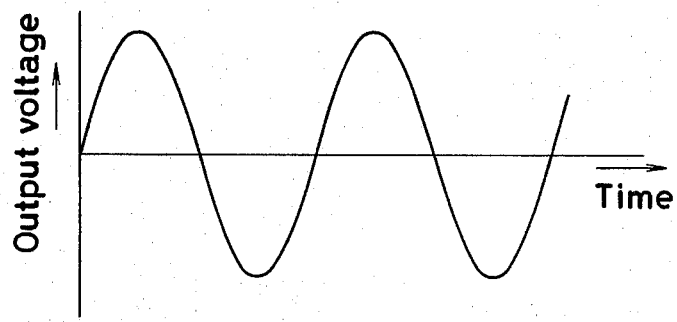
FIGS. 8 and 9 are each a diagram showing a typical electrical vibratory output obtained by the present invention.

In the construction of FIG. 2 or FIG. 5, when the galvanomagnetic element 8 is allowed to vibrate in the horizontal direction in the region of inverted magnetisms, there is generated an electric oscillating output exactly proportional to the vibration as is evident from the characteristics curves of FIG. 3 and FIG. 4. A typical electric output which is obtained when the vibration occurs in the form of a sine wave is illustrated in FIG. 8. The magnitude of this electric oscillating output is determined solely by the amplitude of the vibration involved without reference to the frequency of vibration because the Hall element has constant sensitivity irrespective of frequency. This output is always kept uniform without being decreased even when the frequency of vibrations is very low. This unique performance of the sensor is found in none of the existing sensors.

Figure 9:
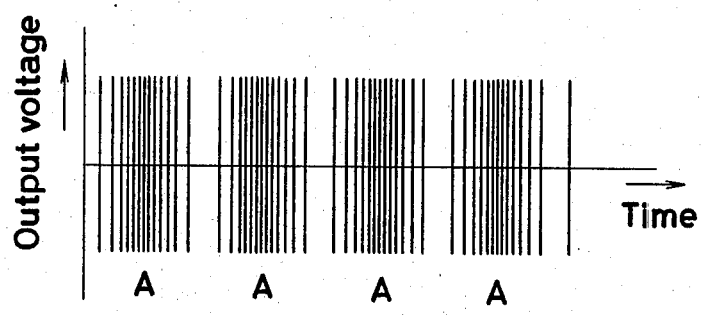

When the amplitude of the vibration is extremely large and the speed of the vibration is high, the magnetoresistive element reciprocates past several magnetic domains. An output pulse signal is obtained for each passage of the magnetoresistive element over the boundary between the magnetic domains and, therefore, the reciprocation of the element past several magnetic domains give rise to a pulse train composed of a plurality of pulse groups as shown in FIG. 9. The pulse group "A" represents the repeating output pulses generated in consequence of the forward passage (or backward passage) of the magnetoresistive element. Consequently, the velocity of vibration or that of displacement can be detected by the number of repeating pulses indicated by "A", while the frequency of vibrations can be detected by the number of the repetitive occurrences of "A". The performance in this case is characterized by the fact that the output voltage remains constant notwithstanding that the number of repeating pulses is proportional to the velocity. This particular embodiment, therefore, possesses a truly excellent property as a digital sensor for vibrations.

In the case of the sensor using the plates of magnetic bubble material made of orthoferrite as described above, the periodic stripe-like magnetic domains which appear where no bias magnetic field is applied have a size of about 100 to 150 $\mu$m. Where the plates are made of garnet or some other similar magnetic bubble material, such magnetic domains have a size of the order of 1 to 5 $\mu$m and the portions of the inverted magnetic fields have a size of sub-micron. According to the present invention, therefore, there is obtained a displacement sensor of extremely high sensitivity.

Figure 10:
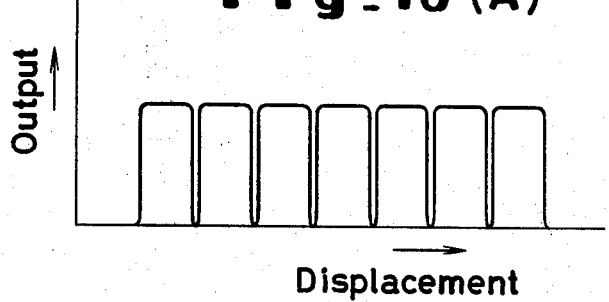
FIGS. 10(A) and 10(B) are diagrams showing the relation between the displacements and the outputs.
Figure 10:
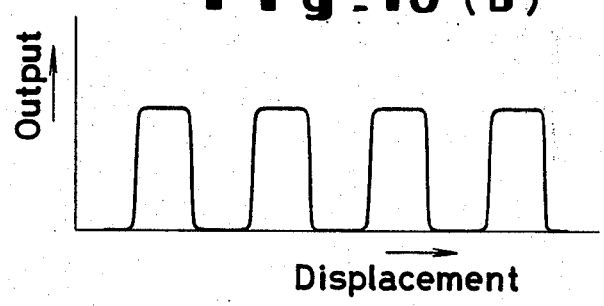

Although the embodiments cited above have been described as using a Hall element as the galvanomagnetic element 8, the galvanomagnetic element need not be limited to the Hall element but may be any other member selected from the group consisting of semiconductor or magnetic elements, i.e. magnetoresistive elements, directional galvanomagnetic elements. (Refer to Proc. IEEE Vol. 57, No. 9, Sept. 1971, p 1349, for example) and other similar elements. When there is used galvanomagnetic element other than a Hall element, the form of the output of the sensor is different from that obtained in the sensor using the Hall element, because in the case of a magnetoresistive element, the output is generated in response only to the intensity of the magnetic field and not to the direction of the magnetic field. The output has the form of FIG. 10(A) in response to the displacement of FIG. 7, for example. And for the vibration of FIG. 8, the output has a frequency twice as high. Similarly for the vibration of FIG. 9, there appears an output of twice as many pulses. Fundamentally, however, the sensor function for converting the displacement or vibration into a corresponding electric output remains unchanged. When a directional galvanomagnetic element is used as the galvanomagnetic element, the output in response to the displacement of FIG. 7 has the form of FIG. 10(B) because the sensor responds only to the magnetic field in one direction.

Figure 11:
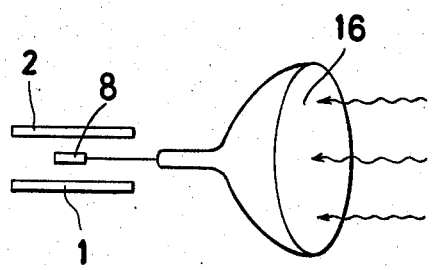
FIG. 11 is an explanatory view illustrating the displacement sensor of the present invention as used in a pressure-electric signal conversion apparatus.
Figure 12:
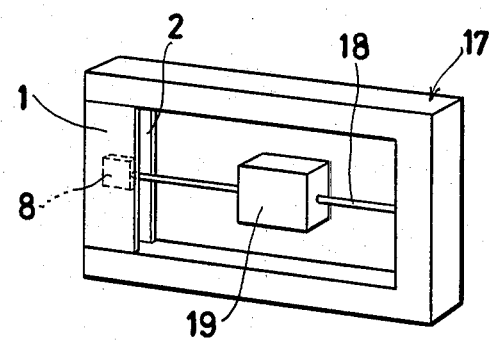
FIG. 12 is an explanatory view illustrating the displacement sensor of the present invention when used as an accelerometer.

Since the sensor of the present invention is formed by the combination of a pair of plates of magnetic material possessed of alternately and periodically inverted magnetic fields and a minute galvanomagnetic element as described in detail above, the relative displacement and the relative vibration between the galvanomagnetic element and the magnetic plates can be converted into corresponding stable electric outputs of constant output voltage. The displacement sensor of the present invention can, therefore, be used in machines and instruments requiring precise measurement of minute displacement or vibration, such as seismometers, hemadinamometers, pulsimeters, etc. and makes the measurement easy and exact. According to the present invention, it is also possible to convert a minute sound wave or pressure into an electric signal corresponding to the strength of the sound wave or pressure by connecting a diaphragm 16 with the galvanomagnetic element disposed between the pair of plates as shown in FIG. 11 and, by fixing the pair of plates at a given interval so as to bridge the free ends of a U-shaped frame 17 and installing on the frame a resilient plate 18 provided with a galvanomagnetic element 8 at the free end thereof and with a mass member 19 at the center thereof so that the galvanomagnetic element is disposed between the pair of plates, as shown in FIG. 12, it is further possible to measure relative displacement produced between the galvanomagnetic element and the pair of plates when the frame is move and, in this case, the present invention functions as an accelerometer.

As described above, the present invention has made it possible to measure minute displacement or vibration of sub-micron order and, therefore, can be utilized in various scientific and industrial branches.

What is claimed is:

1. A displacement sensor for detecting very minute displacements in a non-contact state, which sensor comprises a pair of plates of magnetic bubble material disposed in parallel with each other with a space left therebetween, means for applying external magnetic fields in parallel to said pair of plates said pair of plates having magnetic strip domains formed therein at regular intervals by application of external magnetic fields in parallel to the surfaces of said pair of plates, said space consequently forming therein magnetic fields periodically alternately inverted in the lengthwise direction of said pair of plates, a galvanomagnetic element disposed within said magnetic fields to be retained in a non-contact relation with said pair of plates, means for retaining said galvanomagnetic element so as to move parallel to the inner surfaces of said pair of plates, means for applying an input electric current to said galvanomagnetic element, means for obtaining an output signal from said galvanomagnetic element, and means for measuring the obtained output signal, whereby the minute displacements of said galvanomagnetic element are detected by the change of the output signals of said galvanomagnetic element obtained.

2. A displacement sensor for detecting very minute displacements in a non-contact state, which sensor comprises a pair of plates, with one plate of magnetic bubble material and one plate of ferromagnetic material, disposed in parallel with each other with a space left therebetween, means for applying external magnetic fields in parallel to said pair of plates said plate of magnetic bubble material having magnetic strip domains formed therein at regular intervals by application of external magnetic fields in parallel to the surface of said plate of magnetic bubble material, said space consequently forming therein magnetic fields periodically alternately inverted in the lengthwise direction of said plate of magnetic bubble material, a galvanomagnetic element disposed within said magnetic fields to be retained in a non-contact relation with said pair of plates, means for retaining said galvanomagnetic element so as to move parallel to the inner surfaces of said pair of plates, means for applying an input electric current to said galvanomagnetic element, means for obtaining an output signal from said galvanomagnetic element, and means for measuring the obtained output signal, whereby the minute displacements of said galvanomagnetic element are detected by the change of the output signals of said galvanomagnetic element obtained.

3. The displacement sensor according to claim 1, wherein said galvanomagnetic element is provided with a mechanism adapted to produce displacement past the boundary of magnetic inversion.

4. The displacement sensor according to claim 1, wherein said galvanomagnetic element is provided with a mechanism adapted to produce displacement past a plurality of inverted magnetic fields.

5. The displacement sensor according to claim 1, wherein said galvanomagnetic element is a Hall element.

6. The displacement sensor according to claim 1, wherein said galvanomagnetic element is a directional magnetoelectric element.

7. The displacement sensor according to claim 1, wherein said galvanomagnetic element is a magnetoresistive element.

* * * * *